US011222823B2

(12) United States Patent
Sekiya

(10) Patent No.: US 11,222,823 B2
(45) Date of Patent: Jan. 11, 2022

(54) WAFER PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 52 days.

(21) Appl. No.: 16/781,458

(22) Filed: Feb. 4, 2020

(65) Prior Publication Data

US 2020/0266103 A1 Aug. 20, 2020

(30) Foreign Application Priority Data

Feb. 15, 2019 (JP) .............................. JP2019-025978

(51) Int. Cl.
| | |
|---|---|
| *H01L 21/78* | (2006.01) |
| *H01L 21/683* | (2006.01) |
| *H01L 21/268* | (2006.01) |
| *B23K 26/364* | (2014.01) |
| *H01L 21/68* | (2006.01) |

(Continued)

(52) U.S. Cl.
CPC .......... *H01L 21/78* (2013.01); *H01L 21/6836* (2013.01); *H01L 22/12* (2013.01); *B32B 9/045* (2013.01); *B32B 37/10* (2013.01); *B32B 2457/14* (2013.01)

(58) Field of Classification Search
CPC .............. B28D 5/0082; B32B 38/0004; B32B 38/0012; H01L 21/67132; H01L 21/78
See application file for complete search history.

(56) References Cited

U.S. PATENT DOCUMENTS 6,007,920 A * 12/1999 Umehara .............. H01L 21/304
257/E21.237
2007/0293020 A1* 12/2007 Pressel ................. B28D 5/0011
438/463

(Continued)

FOREIGN PATENT DOCUMENTS

CN 109870756 A * 6/2019
JP 07045556 A 2/1995

OTHER PUBLICATIONS

Harada, Shigenori, U.S. Appl. No. 16/400,209, filed May 1, 2019.

(Continued)

*Primary Examiner* — Brian Turner
(74) *Attorney, Agent, or Firm* — Greer, Burns & Crain, Ltd.

(57) ABSTRACT

A wafer processing method for dividing a wafer into individual device chips. The wafer processing method includes a thermocompression bonding sheet providing step of positioning the wafer in an inside opening of a ring frame and providing a thermocompression bonding sheet on a back side of the wafer and on a back side of the ring frame, a uniting step of heating the thermocompression bonding sheet as applying a pressure to the thermocompression bonding sheet to thereby unite the wafer and the ring frame through the thermocompression bonding sheet by thermocompression bonding, a dividing step of cutting the wafer to thereby form a plurality of dividing grooves and dividing the wafer into the individual device chips, a flattening step of flattening the thermocompression bonding sheet, and a back side observing step of observing the back side of each device chip through the thermocompression bonding sheet.

17 Claims, 10 Drawing Sheets

(51) Int. Cl.
*H01L 21/66* (2006.01)
*B32B 37/10* (2006.01)
*B32B 9/04* (2006.01)

(56) References Cited

U.S. PATENT DOCUMENTS

| | | | | |
|---|---|---|---|---|
| 2011/0180939 A1* | 7/2011 | Sasaki | ............... | H01L 24/83 |
| | | | | 257/783 |
| 2015/0228526 A1* | 8/2015 | Saeki | ............... | C09J 7/401 |
| | | | | 438/464 |
| 2018/0142130 A1* | 5/2018 | Hayash | ............... | C09J 133/08 |
| 2019/0057936 A1* | 2/2019 | Gupta | ............... | H01L 23/562 |

OTHER PUBLICATIONS

Harada, Shigenori, U.S. Appl. No. 16/401,145, filed May 2, 2019.
Harada, Shigenori, U.S. Appl. No. 16/419,126, filed May 22, 2019.
Harada, Shigenori, U.S. Appl. No. 16/419,139, filed May 22, 2019.
Harada, Shigenori, U.S. Appl. No. 16/453,051, filed Jun. 26, 2019.
Harada, Shigenori, U.S. Appl. No. 16/453,503, filed Jun. 26, 2019.
Harada, Shigenori, U.S. Appl. No. 16/531,278, filed Aug. 5, 2019.
Harada, Shigenori, U.S. Appl. No. 16/531,341, filed Aug. 5, 2019.
Harada, Shigenori, U.S. Appl. No. 16/554,914, filed Aug. 29, 2019.
Harada, Shigenori, U.S. Appl. No. 16/554,928, filed Aug. 29, 2019.
Harada, Shigenori, U.S. Appl. No. 16/598,708, filed Oct. 10, 2019.
Harada, Shigenori, U.S. Appl. No. 16/599,502, filed Oct. 11, 2019.
Harada, Shigenori, U.S. Appl. No. 16/674,203, filed Nov. 5, 2019.
Harada, Shigenori, U.S. Appl. No. 16/674,276, filed Nov. 5, 2019.
Harada, Shigenori, U.S. Appl. No. 16/704,369, filed Dec. 5, 2019.
Harada, Shigenori, U.S. Appl. No. 16/696,204, filed Nov. 26, 2019.
Harada, Shigenori, U.S. Appl. No. 16/743,137, filed Jan. 15, 2020.
Harada, Shigenori, U.S. Appl. No. 16/743,176, filed Jan. 15, 2020.
Harada, Shigenori, U.S. Appl. No. 16/752,943, filed Jan. 27, 2020.
Harada, Shigenori, U.S. Appl. No. 16/774,689, filed Jan. 28, 2020.
Harada, Shigenori, U.S. Appl. No. 16/799,291, filed Feb. 24, 2020.
Harada, Shigenori, U.S. Appl. No. 16/799,161, filed Feb. 25, 2020.
Harada, Shigenori, U.S. Appl. No. 16/831,953, filed Mar. 27, 2020.
Harada, Shigenori, U.S. Appl. No. 16/832,266, filed Mar. 27, 2020.
Harada, Shigenori, U.S. Appl. No. 16/870,353, filed May 8, 2020.
Harada, Shigenori, U.S. Appl. No. 16/870,395, filed May 8, 2020.
Harada, Shigenori, U.S. Appl. No. 16/894,108, filed Jun. 5, 2020.
Harada, Shigenori, U.S. Appl. No. 16/895,186, filed Jun. 8, 2020.
Harada, Shigenori, U.S. Appl. No. 16/916,829, filed Jun. 30, 2020.
Harada, Shigenori, U.S. Appl. No. 16/944,347, filed Jul. 31, 2020.
Harada, Shigenori, U.S. Appl. No. 17/014,572, filed Sep. 8, 2020.
Harada, Shigenori, U.S. Appl. No. 17/063,885, filed Oct. 6, 2020.
Harada, Shigenori, U.S. Appl. No. 17/068,936, filed Oct. 13, 2020.
Harada, Shigenori, U.S. Appl. No. 17/083,526, filed Oct. 29, 2020.
Harada, Shigenori, U.S. Appl. No. 16/916,408, filed Jun. 30, 2020.
Harada, Shigenori, U.S. Appl. No. 16/944,382, filed Jul. 31, 2020.
Harada, Shigenori, U.S. Appl. No. 17/015,360, filed Sep. 9, 2020.
Harada, Shigenori, U.S. Appl. No. 17/063,819, filed Oct. 6, 2020.
Harada, Shigenori, U.S. Appl. No. 17/068,925, filed Oct. 13, 2020.
Harada, Shigenori, U.S. Appl. No. 17/083,552, filed Oct. 29, 2020.

* cited by examiner

WAFER PROCESSING METHOD

BACKGROUND OF THE INVENTION

Field of the Invention

The present invention relates to a wafer processing method for dividing a wafer along a plurality of division lines to obtain a plurality of individual device chips, the division lines being formed on the front side of the wafer to thereby define a plurality of separate regions where a plurality of devices are individually formed.

Description of the Related Art

In a fabrication process for device chips to be used in electronic equipment such as mobile phones and personal computers, a plurality of crossing division lines (streets) are first set on the front side of a wafer formed of a semiconductor, for example, thereby defining a plurality of separate regions on the front side of the wafer. In each separate region, a device such as an integrated circuit (IC), a large-scale integration (LSI), and a light emitting diode (LED) is next formed. Thereafter, a ring frame having an inside opening is prepared, in which an adhesive tape called a dicing tape is previously attached in its peripheral portion to the ring frame (the back side of the ring frame) so as to close the inside opening of the ring frame. Thereafter, a central portion of the adhesive tape is attached to the back side of the wafer such that the wafer is accommodated in the inside opening of the ring frame. In this manner, the wafer, the adhesive tape, and the ring frame are united together to form a frame unit. Thereafter, the wafer included in this frame unit is processed to be divided along each division line, thereby obtaining a plurality of individual device chips including the respective devices.

For example, a cutting apparatus is used to divide the wafer. The cutting apparatus includes a chuck table for holding the wafer through the adhesive tape and a cutting unit for cutting the wafer. The cutting unit includes a cutting blade for cutting the wafer and a spindle for rotating the cutting blade. The cutting blade has a central through hole, and the spindle is fitted in this central through hole of the cutting blade, so that the cutting blade and the spindle are rotated as a unit. An annular abrasive portion is formed around the outer circumference of the cutting blade, so as to cut the wafer. In cutting the wafer by using this cutting apparatus, the frame unit is placed on the chuck table, and the wafer is held through the adhesive tape on the upper surface of the chuck table. In this condition, the spindle is rotated to thereby rotate the cutting blade, and the cutting unit is next lowered to a predetermined height. Thereafter, the chuck table and the cutting unit are relatively moved in a direction parallel to the upper surface of the chuck table. Accordingly, the wafer is cut along each division line by the cutting blade being rotated, so that the wafer is divided.

Thereafter, the frame unit is transferred from the cutting apparatus to another apparatus for applying ultraviolet light to the adhesive tape to thereby reduce the adhesion of the adhesive tape. Thereafter, each device chip is picked up from the adhesive tape. As a processing apparatus capable of producing the device chips with high efficiency, there is a cutting apparatus capable of continuously performing the operation for dividing the wafer and the operation for applying ultraviolet light to the adhesive tape (see Japanese Patent No. 3076179, for example). Each device chip picked up from the adhesive tape is next mounted on a predetermined wiring substrate or the like.

SUMMARY OF THE INVENTION

When the wafer is cut by the cutting apparatus to form a dividing groove along each street, there is a case that each device chip may have a defect such as chipping along the side edge of each dividing groove. If the size of the chipping exceeds an allowable range, the performance of each device chip is impaired. To cope with this problem, it is desired to observe each device chip obtained by cutting the wafer, thereby checking whether or not the chipping has occurred or checking whether or not the size of the chipping falls within an allowable range.

The adhesive tape for uniting the wafer and the ring frame includes a base layer formed from a polyvinyl chloride sheet, for example, and an adhesive layer formed on the base layer. In the case of cutting the wafer to form the dividing groove along each street and then observing the back side of each device chip obtained from the wafer, the back side of each device chip is observed through the adhesive tape. However, light scatters on the adhesive layer included in the adhesive tape, so that visibility is impaired by the adhesive layer of the adhesive tape, so that the back side of each device chip cannot be clearly observed.

It is therefore an object of the present invention to provide a wafer processing method which can clearly observe the back side of each device chip to be formed and check the condition of each dividing groove with high accuracy.

In accordance with an aspect of the present invention, there is provided a wafer processing method for dividing a wafer along a plurality of division lines to obtain a plurality of individual device chips, the division lines being formed on a front side of the wafer to thereby define a plurality of separate regions where a plurality of devices are individually formed. The wafer processing method includes a ring frame preparing step of preparing a ring frame having an inside opening for accommodating the wafer, a thermocompression bonding sheet providing step of positioning the wafer in the inside opening of the ring frame and providing a thermocompression bonding sheet on a back side of the wafer and on a back side of the ring frame, the thermocompression bonding sheet having a first surface and a second surface opposite to the first surface, the first surface of the thermocompression bonding sheet coming into contact with the back side of the wafer and the back side of the ring frame, a uniting step of heating the thermocompression bonding sheet as applying a pressure to the thermocompression bonding sheet after performing the thermocompression bonding sheet providing step, thereby uniting the wafer and the ring frame through the thermocompression bonding sheet by thermocompression bonding to form a frame unit in the condition where the front side of the wafer and the front side of the ring frame are exposed, a dividing step of cutting the wafer along each division line by using a cutting apparatus including a rotatable cutting blade after performing the uniting step, thereby forming a dividing groove along each division line to divide the wafer into the individual device chips, and a flattening step of flattening the second surface of the thermocompression bonding sheet in its central area where the first surface of the thermocompression bonding sheet has been bonded to the wafer, before or after performing the dividing step, and a back side observing step of observing a back side of each device chip through the thermocompression bonding sheet from the second surface thereof after performing the flattening step, thereby checking a condition of the dividing groove formed in the dividing step.

Preferably, the flattening step includes a step of using a single-point cutting tool to cut the second surface of the thermocompression bonding sheet in the central area.

Preferably, the back side observing step includes a step of using an imaging unit to image the back side of each device chip.

Preferably, the thermocompression bonding sheet includes a thermoplastic resin sheet selected from the group consisting of a polyolefin sheet and a polyester sheet.

Preferably, the polyolefin sheet is formed of a material selected from the group consisting of polyethylene, polypropylene, and polystyrene.

Preferably, the polyester sheet is formed of a material selected from the group consisting of polyethylene terephthalate and polyethylene naphthalate.

Preferably, the polyolefin sheet is formed of polyethylene, and the polyolefin sheet is heated in the range of 120° C. to 140° C. in the uniting step.

Preferably, the polyolefin sheet is formed of polypropylene, and the polyolefin sheet is heated in the range of 160° C. to 180° C. in the uniting step.

Preferably, the polyolefin sheet is formed of polystyrene, and the polyolefin sheet is heated in the range of 220° C. to 240° C. in the uniting step.

Preferably, the polyester sheet is formed of polyethylene terephthalate, and the polyester sheet is heated in the range of 250° C. to 270° C. in the uniting step.

Preferably, the polyester sheet is formed of polyethylene naphthalate, and the polyester sheet is heated in the range of 160° C. to 180° C. in the uniting step.

Preferably, the wafer is formed of a material selected from the group consisting of silicon, gallium nitride, gallium arsenide, and glass.

In the wafer processing method according to a preferred embodiment of the present invention, the wafer and the ring frame are united by using the thermocompression bonding sheet having no adhesive layer in place of an adhesive tape having an adhesive layer, thereby forming the frame unit composed of the wafer, the ring frame, and the thermocompression bonding sheet united together. The uniting step of uniting the wafer and the ring frame through the thermocompression bonding sheet is realized by thermocompression bonding. After performing the uniting step, the wafer is cut by the cutting blade and thereby divided into the individual device chips. Thereafter, the back side of each device chip obtained by dividing the wafer is observed through the thermocompression bonding sheet, thereby checking the condition of each dividing groove. That is, it is checked whether or not chipping has occurred along the side edge of each dividing groove. Further, in the case that chipping has occurred, it is checked whether or not the size of the chipping exceeds an allowable range.

In forming the frame unit in the uniting step mentioned above, the thermocompression bonding sheet is prepared in the form of a roll and the thermocompression bonding sheet is drawn out from the roll in actual use, for example. Accordingly, both side surfaces of the thermocompression bonding sheet is not flat (i.e., not smooth), so as to avoid close contact between a radially inside portion and a radially outside portion of the thermocompression bonding sheet in the form of the roll. The thermocompression bonding sheet has a first surface and a second surface opposite to the first surface, in which the first surface of the thermocompression bonding sheet is bonded to the wafer by heat. If the second surface of the thermocompression bonding sheet is not flat, light scatters on the second surface of the thermocompression bonding sheet in observing the back side of each device chip through the thermocompression bonding sheet, so that the back side of each device chip cannot be clearly observed. To cope with this problem, in the wafer processing method according to the present invention, the flattening step is performed before or after performing the dividing step to flatten the second surface of the thermocompression bonding sheet in its central portion bonded to the wafer. By performing the flattening step, the back side of each device chip can be clearly observed through the thermocompression bonding sheet, so that whether or not chipping is present in each device chip can be checked with high accuracy.

Accordingly, the present invention can provide a wafer processing method which can clearly observe the back side of each device chip to be formed and check the condition of each dividing groove with high accuracy.

The above and other objects, features, and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

Figure 1:
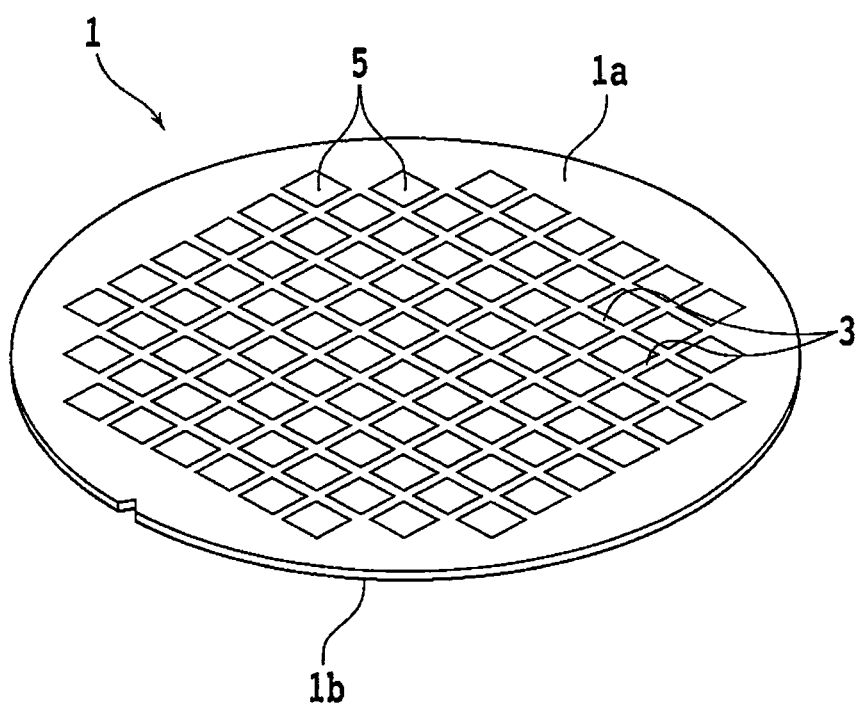
FIG. 1 is a schematic perspective view of a wafer.

A preferred embodiment of the present invention will now be described with reference to the attached drawings. There will first be described a wafer to be processed by a wafer processing method according to this preferred embodiment. FIG. 1 is a schematic perspective view of a wafer 1. The wafer 1 is a substantially disc-shaped substrate formed of a material such as silicon (Si), silicon carbide (SiC), gallium nitride (GaN), and gallium arsenide (GaAs). The wafer 1 may be formed of any other semiconductor materials. Further, the wafer 1 may be formed of a material such as sapphire, glass, and quartz. Examples of the glass include alkaline glass, nonalkaline glass, soda lime glass, lead glass, borosilicate glass, and silica glass. The wafer 1 has a front side 1*a* and a back side 1*b*. A plurality of crossing division lines 3 are formed on the front side 1*a* of the wafer 1 to thereby define a plurality of respective separate regions where a plurality of devices 5 such as ICs, LSIs, and LEDs are formed. The crossing division lines 3 are composed of a plurality of parallel division lines 3 extending in a first direction and a plurality of parallel division lines 3 extending in a second direction perpendicular to the first direction. In the processing method for the wafer 1 according to this preferred embodiment, the wafer 1 is cut along the crossing division lines 3 and thereby divided into a plurality of individual device chips respectively including the plural devices 5.

The wafer 1 is cut by using a cutting apparatus. Prior to loading the wafer 1 into the cutting apparatus, the wafer 1 is united with a thermocompression bonding sheet 9 (see FIG. 3) and a ring frame 7 (see FIG. 2) to thereby form a frame unit. Thus, the wafer 1 is loaded in the form of such a frame unit into the cutting apparatus and then cut into the individual device chips in the cutting apparatus, in which each device chip is supported to the thermocompression bonding sheet 9. Thereafter, the thermocompression bonding sheet 9 is expanded to thereby increase the spacing between any adjacent ones of the device chips. Thereafter, each device chip is picked up by using a pickup apparatus. At this time, the thermocompression bonding sheet 9 functions also as a dicing tape.

The ring frame 7 is formed of a rigid material such as metal, and it has a circular inside opening 7*a* having a diameter larger than that of the wafer 1. The outside shape of the ring frame 7 is substantially circular. The ring frame 7 has a front side 7*b* and a back side 7*c*. In forming the frame unit, the wafer 1 is accommodated in the inside opening 7*a* of the ring frame 7 and positioned in such a manner that the center of the wafer 1 substantially coincides with the center of the inside opening 7*a*. The thermocompression bonding sheet 9 is a flexible (expandable) resin sheet such as a polyolefin sheet and a polyester sheet, for example. The thermocompression bonding sheet 9 is a circular sheet initially having a diameter larger than the outer diameter of the ring frame 7. The thermocompression bonding sheet 9 has no adhesive layer. The thermocompression bonding sheet 9 is a thermoplastic sheet.

The polyolefin sheet is a sheet of a polymer (polyolefin) synthesized by polymerizing alkene as a monomer. Examples of the polyolefin sheet usable as the thermocompression bonding sheet 9 includes a polyethylene sheet, polypropylene sheet, and polystyrene sheet. The polyolefin sheet is transparent or translucent to visible light. Further, the polyester sheet is a sheet of a polymer (polyester) synthesized by polymerizing dicarboxylic acid (compound having two carboxylic groups) and diol (compound having two hydroxyl groups) as a monomer. Examples of the polyester sheet usable as the thermocompression bonding sheet 9 include a polyethylene terephthalate sheet and a polyethylene naphthalate sheet, for example. The polyester sheet is transparent or translucent to visible light.

Since the thermocompression bonding sheet 9 has no adhesive layer, it cannot be attached to the wafer 1 and the ring frame 7 at room temperature. However, the thermocompression bonding sheet 9 is a thermoplastic sheet, so that, when the thermocompression bonding sheet 9 is heated to a temperature near its melting point under a predetermined pressure in a condition where the thermocompression bonding sheet 9 is in contact with the wafer 1 and the ring frame 7, the thermocompression bonding sheet 9 is partially melted and thereby bonded to the wafer 1 and the ring frame 7. That is, by applying heat and pressure to the thermocompression bonding sheet 9 in the condition where the thermocompression bonding sheet 9 is in contact with the wafer 1 and the ring frame 7, the thermocompression bonding sheet 9 can be bonded to the wafer 1 and the ring frame 7. Thusly, in the processing method for the wafer 1 according to this preferred embodiment, all of the wafer 1, the ring frame 7, and the thermocompression bonding sheet 9 are united by thermocompression bonding as mentioned above, thereby forming the frame unit.

Figure 2:
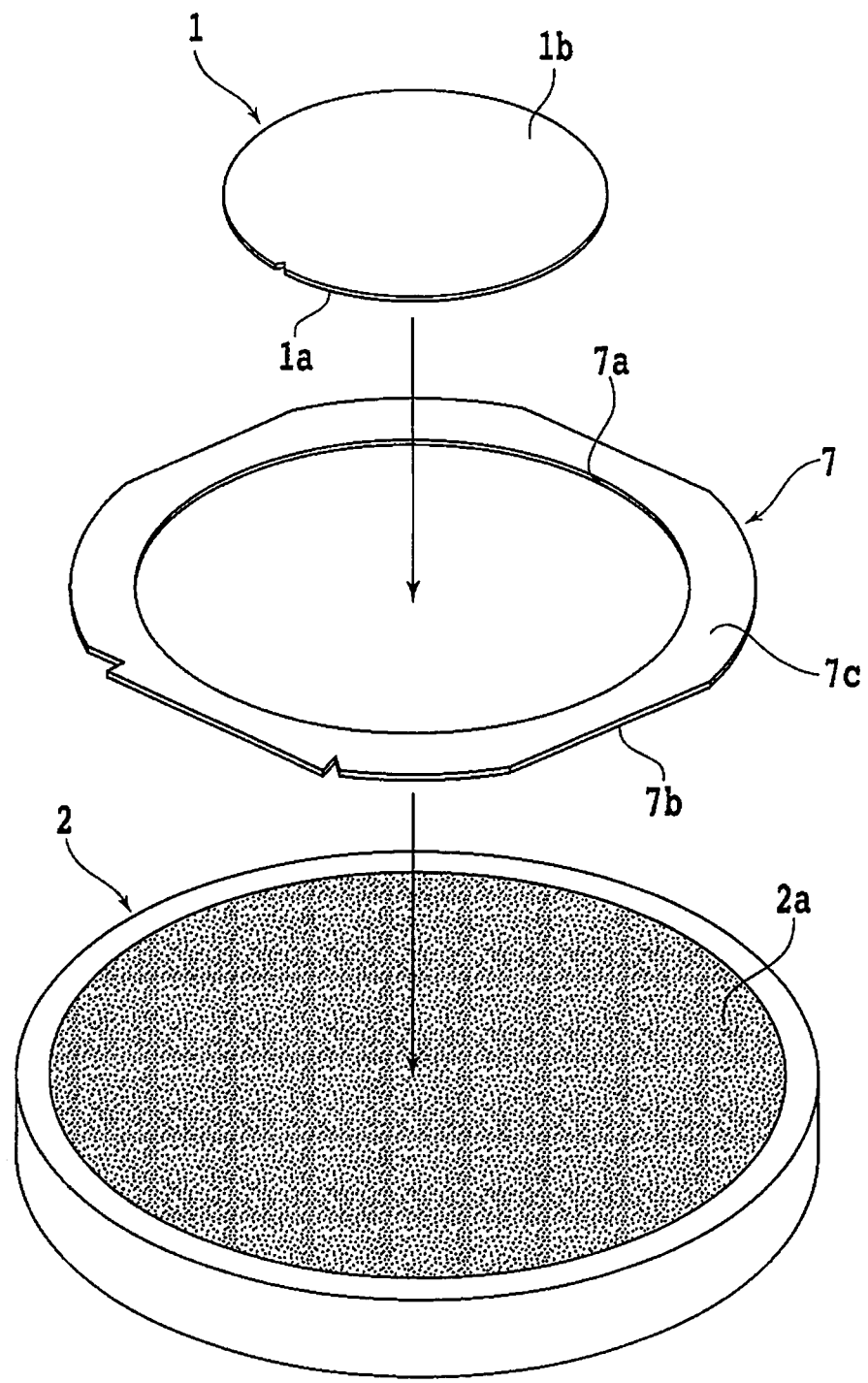
FIG. 2 is a schematic perspective view depicting a manner of positioning the wafer and a ring frame on a holding surface of a chuck table.

The steps of the processing method for the wafer 1 according to this preferred embodiment will now be described. Prior to uniting the wafer 1, the thermocompression bonding sheet 9, and the ring frame 7, a thermocompression bonding providing step is performed by using a chuck table (vacuum table) 2 having a holding surface 2*a* depicted in FIG. 2. FIG. 2 is a schematic perspective view depicting a manner of positioning the wafer 1 and the ring frame 7 on the holding surface 2*a* of the chuck table 2. That is, the thermocompression bonding providing step is performed on the holding surface 2*a* of the chuck table 2 as depicted in FIG. 2. The chuck table 2 has a circular porous member having a diameter larger than the outer diameter of the ring frame 7. The porous member constitutes a central upper portion of the chuck table 2. The porous member has an upper surface functioning as the holding surface 2*a* of the chuck table 2. A suction passage (not depicted) is formed in the chuck table 2, in which one end of the suction passage is connected to the porous member. Further, a vacuum source 2*b* (see FIG. 3) is connected to the other end of the suction passage. The suction passage is provided with a selector 2*c* (see FIG. 3) for switching between an ON condition and an OFF condition. When the ON condition is established by the selector 2*c*, a vacuum produced by the vacuum source 2*b* is applied to a workpiece placed on the holding surface 2*a* of the chuck table 2, thereby holding the workpiece on the chuck table 2 under suction.

Figure 3:
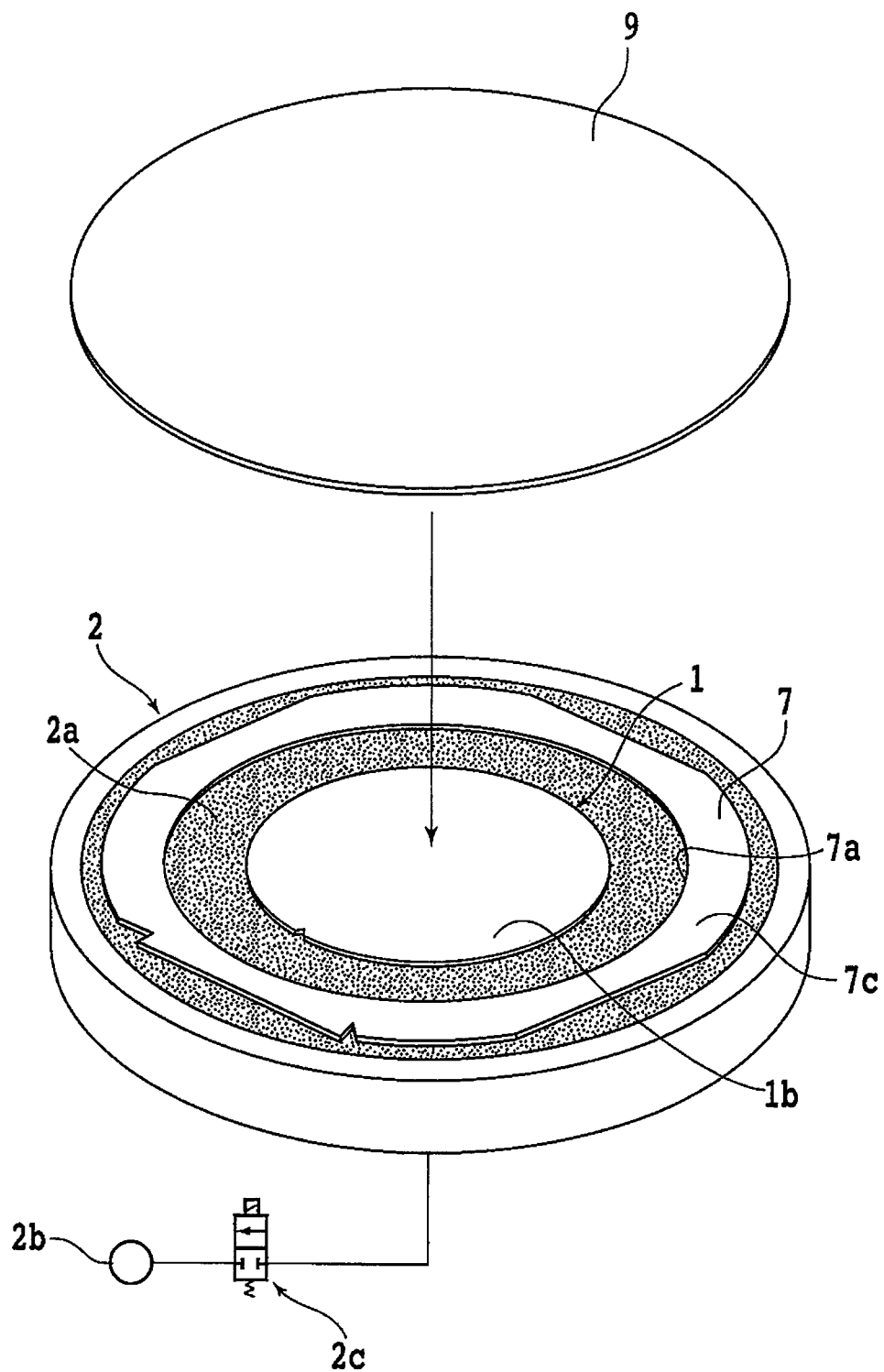
FIG. 3 is a schematic perspective view depicting a thermocompression bonding sheet providing step.

In the thermocompression bonding sheet providing step, the wafer 1 and the ring frame 7 are first placed on the holding surface 2*a* of the chuck table 2 as depicted in FIG. 2. At this time, the front side 1*a* of the wafer 1 is oriented downward, and the front side 7*b* of the ring frame 7 is also oriented downward. In this condition, the wafer 1 is positioned in the inside opening 7*a* of the ring frame 7. Thereafter, as depicted in FIG. 3, the thermocompression bonding sheet 9 is provided on the back side 1*b* (upper surface) of the wafer 1 and on the back side 7*c* (upper surface) of the ring frame 7. FIG. 3 is a schematic perspective view depicting a manner of providing the thermocompression bonding sheet 9 on the wafer 1 and the ring frame 7. That is, as depicted in FIG. 3, the thermocompression bonding sheet 9 is provided so as to fully cover the wafer 1 and the ring frame 7. In the thermocompression bonding sheet providing step, the diameter of the thermocompression bonding sheet 9 is set larger than the diameter of the holding surface 2*a* of the chuck table 2. Unless the diameter of the thermocompression bonding sheet 9 is larger than the diameter of the holding surface 2*a*, there may arise a problem such that, when the vacuum from the vacuum source 2*b* is applied to the holding surface 2*a* of the chuck table 2 in a uniting step to be performed later, the vacuum may leak from any gap between the thermocompression bonding sheet 9 and the holding surface 2*a* because the holding surface 2*a* is not fully covered with the thermocompression bonding sheet 9, so that a pressure cannot be properly applied to the thermocompression bonding sheet 9.

Figure 4:
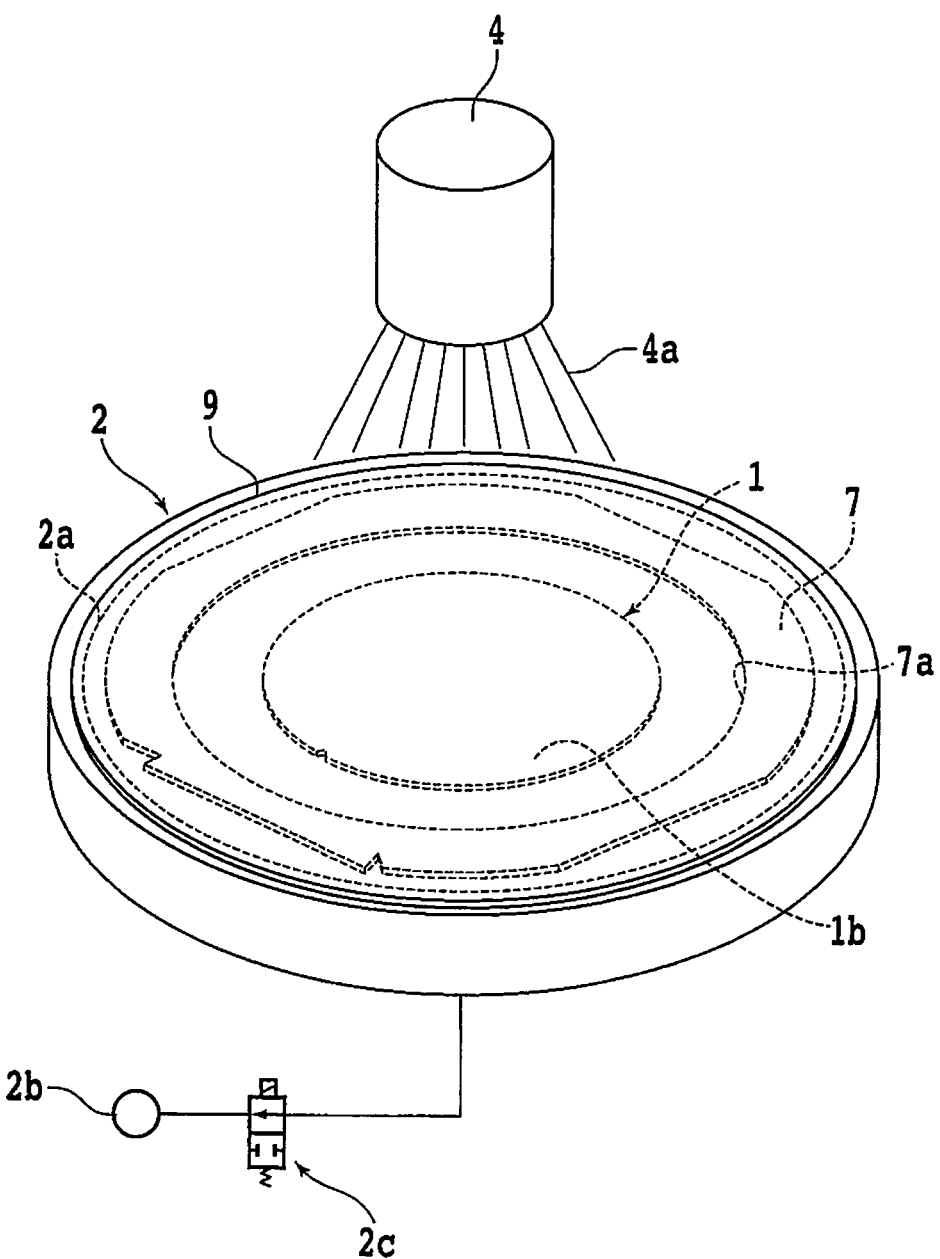
FIG. 4 is a schematic perspective view depicting a uniting step.

In the processing method for the wafer 1 according to this preferred embodiment, a uniting step is next performed in such a manner that the thermocompression bonding sheet 9 is heated to unite the wafer 1 and the ring frame 7 through the thermocompression bonding sheet 9 by thermocompression bonding. FIG. 4 is a schematic perspective view depicting the uniting step according to this preferred embodiment. As depicted in FIG. 4, the thermocompression bonding sheet 9 transparent or translucent to visible light is provided so as to fully cover the wafer 1, the ring frame 7, and the holding surface 2a of the chuck table 2, which are all depicted by broken lines in FIG. 4. In the uniting step, the selector 2c is operated to establish the ON condition where the vacuum source 2b is in communication with the porous member of the chuck table 2, i.e., the holding surface 2a of the chuck table 2, so that a vacuum produced by the vacuum source 2b is applied to the thermocompression bonding sheet 9 provided on the chuck table 2. Accordingly, the thermocompression bonding sheet 9 is brought into close contact with the wafer 1 and the ring frame 7 by the atmospheric pressure applied to the upper surface of the thermocompression bonding sheet 9.

Thereafter, the thermocompression bonding sheet 9 is heated in a condition where the thermocompression bonding sheet 9 is sucked by the vacuum source 2b, thereby performing thermocompression bonding. In this preferred embodiment depicted in FIG. 4, for example, the heating of the thermocompression bonding sheet 9 is effected by a heat gun 4 provided above the chuck table 2. The heat gun 4 includes heating means such as a heating wire and an air blowing mechanism such as a fan. Accordingly, the heat gun 4 can heat ambient air and blow the heated air. In a condition where the vacuum from the vacuum source 2b is applied to the thermocompression bonding sheet 9, the heat gun 4 is operated to supply hot air 4a to the upper surface of the thermocompression bonding sheet 9. Accordingly, when the thermocompression bonding sheet 9 is heated to a predetermined temperature, the thermocompression bonding sheet 9 is bonded to the wafer 1 and the ring frame 7 by thermocompression bonding.

Figure 5:
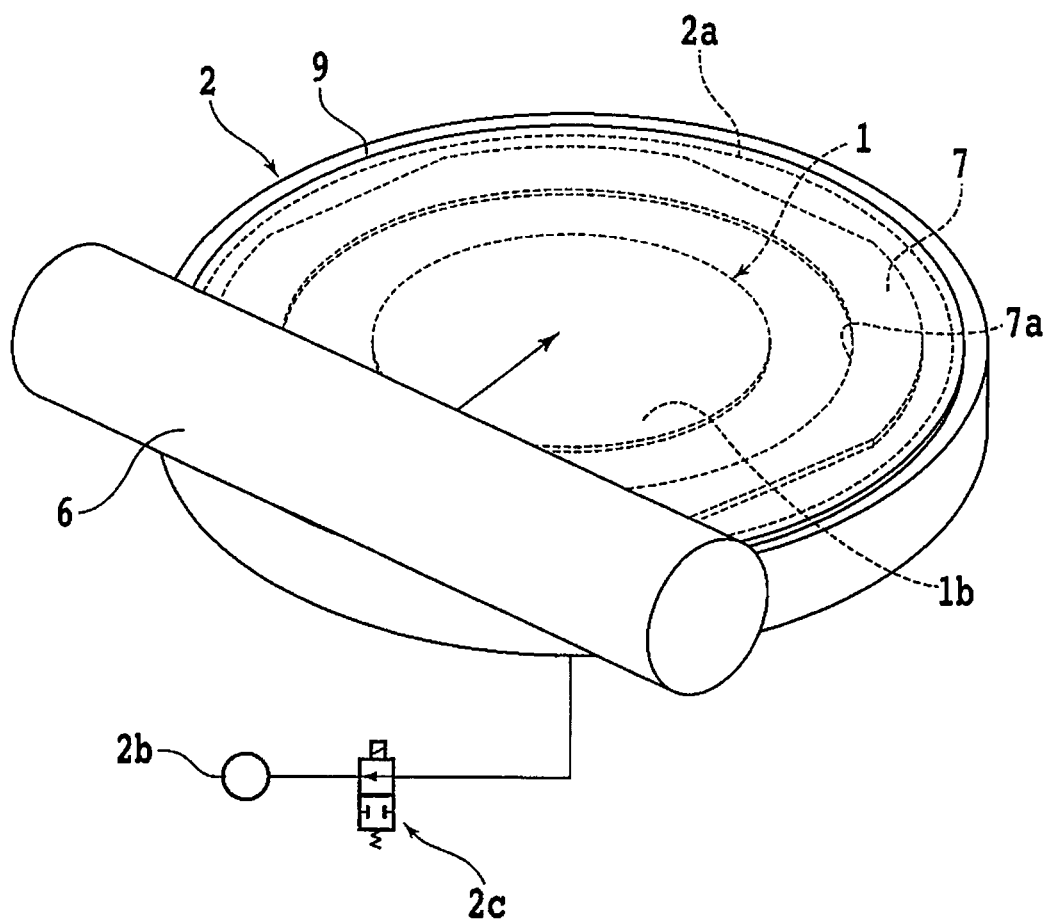
FIG. 5 is a schematic perspective view depicting a modification of the uniting step.

Another method for heating the thermocompression bonding sheet 9 may be adopted. For example, any member heated to a predetermined temperature may be pressed on the thermocompression bonding sheet 9 against the wafer 1 and the ring frame 7. FIG. 5 is a schematic perspective view depicting such a modification of the uniting step. As depicted in FIG. 5, the thermocompression bonding sheet 9 transparent or translucent to visible light is provided so as to fully cover the wafer 1, the ring frame 7, and the holding surface 2a of the chuck table 2, which are all depicted by broken lines in FIG. 5. In this modification depicted in FIG. 5, a heat roller 6 including a heat source is used. More specifically, the vacuum produced by the vacuum source 2b is first applied to the thermocompression bonding sheet 9, so that the thermocompression bonding sheet 9 is brought into close contact with the wafer 1 and the ring frame 7 by the atmospheric pressure applied to the upper surface of the thermocompression bonding sheet 9.

Thereafter, the heat roller 6 is heated to a predetermined temperature, and next placed on the holding surface 2a of the chuck table 2 at one end lying on the outer circumference of the holding surface 2a as depicted in FIG. 5. Thereafter, the heat roller 6 is rotated about its axis to roll on the chuck table 2 through the thermocompression bonding sheet 9 from the above one end to another end diametrically opposite to the above one end. As a result, the thermocompression bonding sheet 9 is bonded to the wafer 1 and the ring frame 7 by thermocompression bonding. In the case that a force for pressing the thermocompression bonding sheet 9 is applied by the heat roller 6, the thermocompression bonding is effected at a pressure higher than atmospheric pressure. Preferably, a cylindrical surface of the heat roller 6 is coated with fluororesin. Further, the heat roller 6 may be replaced by any iron-like pressure member having a flat base plate and containing a heat source. In this case, the pressure member is heated to a predetermined temperature to thereby provide a hot plate, which is next pressed on the thermocompression bonding sheet 9 held on the chuck table 2.

Figure 6:
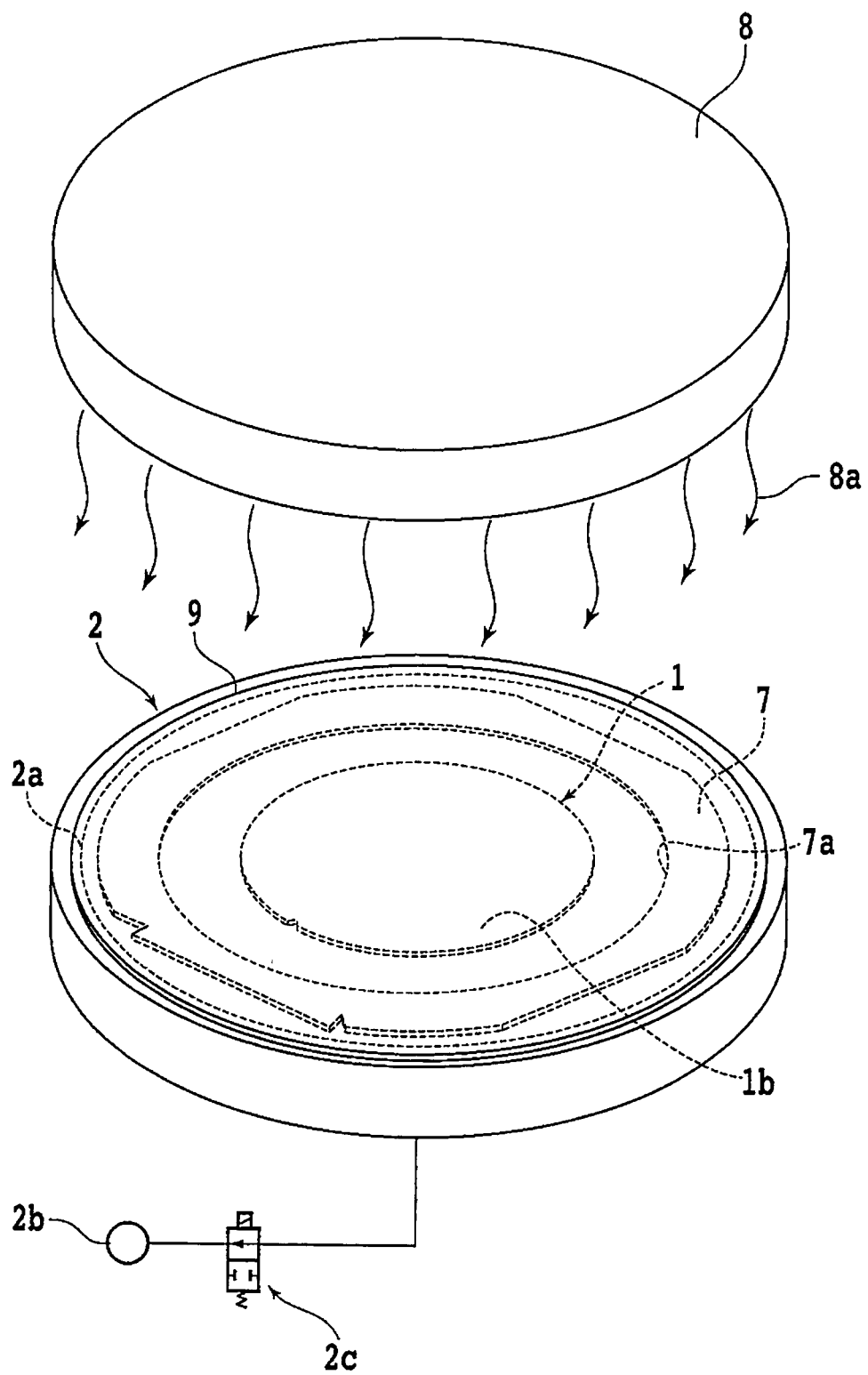
FIG. 6 is a schematic perspective view depicting another modification of the uniting step.

Still another method for heating the thermocompression bonding sheet 9 may be adopted in the following manner. FIG. 6 is a schematic perspective view depicting such another modification of the uniting step. As depicted in FIG. 6, the thermocompression bonding sheet 9 transparent or translucent to visible light is provided so as to fully cover the wafer 1, the ring frame 7, and the holding surface 2a of the chuck table 2, which are all depicted by broken lines in FIG. 6. In this modification depicted in FIG. 6, an infrared lamp 8 is provided above the chuck table 2 to heat the thermocompression bonding sheet 9. The infrared lamp 8 can apply infrared light 8a having an absorption wavelength to at least the material of the thermocompression bonding sheet 9. Also in the modification depicted in FIG. 6, the vacuum produced by the vacuum source 2b is first applied to the thermocompression bonding sheet 9, so that the thermocompression bonding sheet 9 is brought into close contact with the wafer 1 and the ring frame 7 by the atmospheric pressure applied to the upper surface of the thermocompression bonding sheet 9. Thereafter, the infrared lamp 8 is operated to apply the infrared light 8a to the thermocompression bonding sheet 9, thereby heating the thermocompression bonding sheet 9. As a result, the thermocompression bonding sheet 9 is bonded to the wafer 1 and the ring frame 7 by thermocompression bonding.

When the thermocompression bonding sheet 9 is heated to a temperature near its melting point by performing any one of the above methods, the thermocompression bonding sheet 9 is bonded to the wafer 1 and the ring frame 7 by thermocompression bonding. After bonding the thermocompression bonding sheet 9, the selector 2c is operated to establish the OFF condition where the communication between the porous member of the chuck table 2 and the vacuum source 2b is canceled. Accordingly, the suction holding by the chuck table 2 is canceled.

Figure 7A:
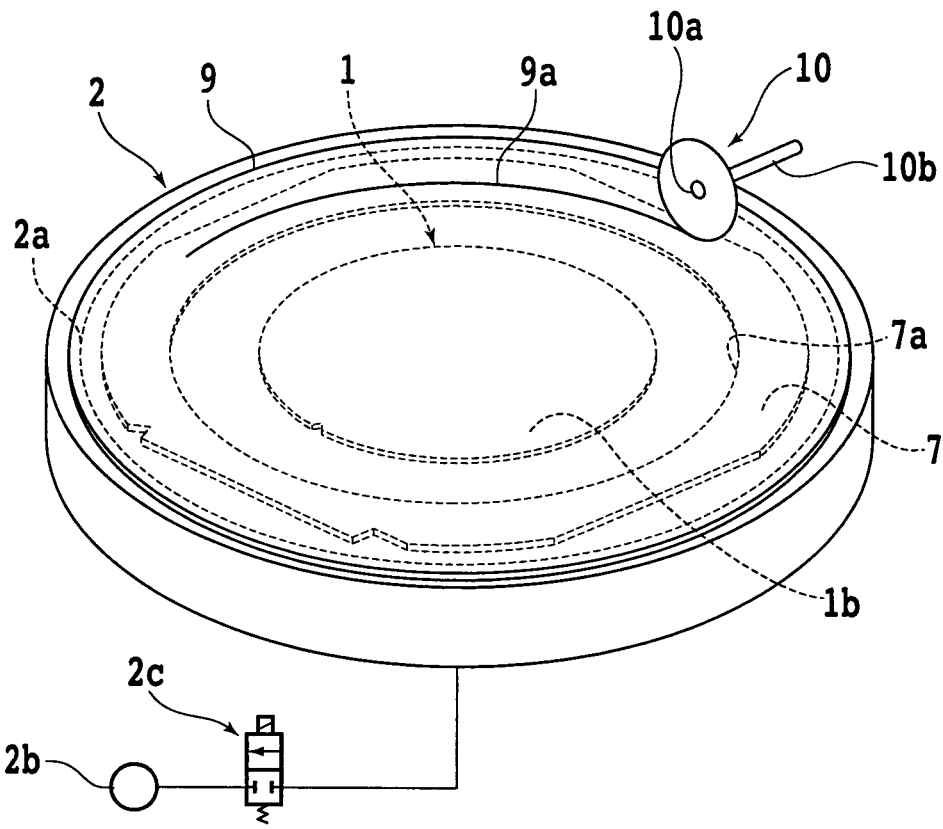
FIG. 7A is a schematic perspective view depicting a manner of cutting the thermocompression bonding sheet after performing the uniting step.

Thereafter, the thermocompression bonding sheet 9 is circularly cut along the outer circumference of the ring frame 7 to remove an unwanted peripheral portion of the thermocompression bonding sheet 9. FIG. 7A is a schematic perspective view depicting a manner of cutting the thermocompression bonding sheet 9. As depicted in FIG. 7A, a disc-shaped (annular) cutter 10 is used to cut the thermocompression bonding sheet 9. The cutter 10 has a central through hole 10a in which a rotating shaft 10b is fitted. Accordingly, the cutter 10 is rotatable about the axis of the rotating shaft 10b. First, the cutter 10 is positioned above the ring frame 7. At this time, the rotating shaft 10b is set so as to extend in the radial direction of the chuck table 2. Thereafter, the cutter 10 is lowered until the outer circumference (cutting edge) of the cutter 10 comes into contact with the thermocompression bonding sheet 9 placed on the ring frame 7. That is, the thermocompression bonding sheet 9 is caught between the cutter 10 and the ring frame 7, so that the thermocompression bonding sheet 9 is cut by the cutter 10 to form a cut mark 9a. Further, the cutter 10 is rolled on the thermocompression bonding sheet 9 along a circular line set between the inner circumference of the ring frame 7 (i.e., the periphery of the inside opening 7a of the ring frame 7) and the outer circumference of the ring frame 7, thereby circularly forming the cut mark 9a along the above circular line. As a result, a predetermined central portion of the thermocompression bonding sheet 9 is surrounded by the circular cut mark 9a. Thereafter, a remaining peripheral portion of the thermocompression bonding sheet 9 outside the circular cut mark 9a is removed. That is, an unwanted peripheral portion of the thermocompression bonding sheet 9 including an outermost peripheral portion outside the outer circumference of the ring frame 7 can be removed.

Figure 7B:
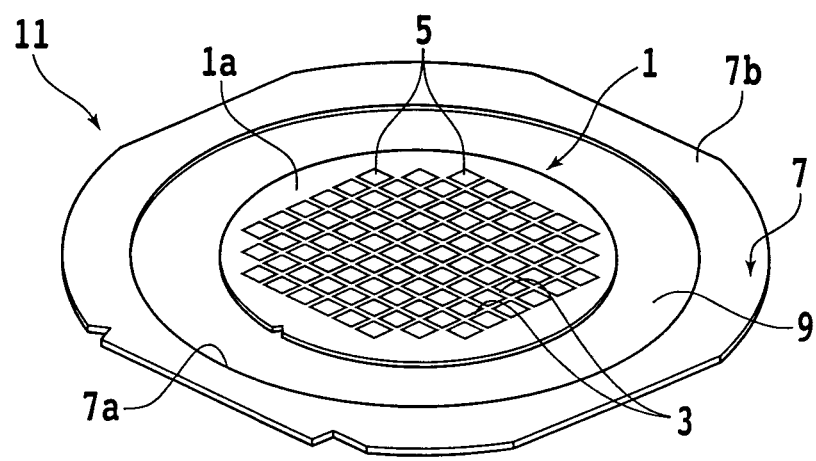
FIG. 7B is a schematic perspective view of a frame unit formed by performing the step depicted in FIG. 7A.

The cutter 10 may be replaced by an ultrasonic cutter for cutting the thermocompression bonding sheet 9. Further, a vibration source for vibrating the cutter 10 at a frequency in an ultrasonic band may be connected to the cutter 10. Further, in cutting the thermocompression bonding sheet 9, the thermocompression bonding sheet 9 may be cooled to be hardened in order to facilitate the cutting operation. By cutting the thermocompression bonding sheet 9 as mentioned above, a frame unit 11 depicted in FIG. 7B is formed, in which the frame unit 11 is composed of the wafer 1, the ring frame 7, and the thermocompression bonding sheet 9 united together. That is, the wafer 1 and the ring frame 7 are united with each other through the thermocompression bonding sheet 9 to form the frame unit 11 as depicted in FIG. 7B. FIG. 7B is a schematic perspective view of the frame unit 11 in a condition where the front side 1a of the wafer 1 and the front side 7b of the ring frame 7 are exposed upward.

In performing the thermocompression bonding as mentioned above, the thermocompression bonding sheet 9 is heated preferably to a temperature lower than or equal to the melting point of the thermocompression bonding sheet 9. If the heating temperature is higher than the melting point of the thermocompression bonding sheet 9, there is a possibility that the thermocompression bonding sheet 9 may be melted to such an extent that the shape of the thermocompression bonding sheet 9 cannot be maintained. Further, the thermocompression bonding sheet 9 is heated preferably to a temperature higher than or equal to the softening point of the thermocompression bonding sheet 9. If the heating temperature is lower than the softening point of the thermocompression bonding sheet 9, the thermocompression bonding cannot be properly performed. Accordingly, the thermocompression bonding sheet 9 is heated preferably to a temperature higher than or equal to the softening point of the thermocompression bonding sheet 9 and lower than or equal to the melting point of the thermocompression bonding sheet 9. Further, there is a case that the softening point of the thermocompression bonding sheet 9 may be unclear. To cope with such a case, in performing the thermocompression bonding, the thermocompression bonding sheet 9 is heated preferably to a temperature higher than or equal to a preset temperature and lower than or equal to the melting point of the thermocompression bonding sheet 9, the preset temperature being lower by 20° C. than the melting point of the thermocompression bonding sheet 9.

In the case that the polyolefin sheet usable as thermocompression bonding sheet 9 is a polyethylene sheet, the heating temperature in the uniting step is preferably set in the range of 120° C. to 140° C. Further, in the case that the polyolefin sheet is a polypropylene sheet, the heating temperature in the uniting step is preferably set in the range of 160° C. to 180° C. Further, in the case that the polyolefin sheet is a polystyrene sheet, the heating temperature in the uniting step is preferably set in the range of 220° C. to 240° C. Further, in the case that the polyester sheet usable as the thermocompression bonding sheet 9 is a polyethylene terephthalate sheet, the heating temperature in the uniting step is preferably set in the range of 250° C. to 270° C. Further, in the case that the polyester sheet is a polyethylene naphthalate sheet, the heating temperature in the uniting step is preferably set in the range of 160° C. to 180° C.

The heating temperature is defined herein as the temperature of the thermocompression bonding sheet 9 to be heated in performing the uniting step. As the heat sources included in the heat gun 4, the heat roller 6, and the infrared lamp 8 mentioned above, some kind of heat source capable of setting an output temperature has been put into practical use. However, even when such a heat source is used to heat the thermocompression bonding sheet 9, the temperature of the thermocompression bonding sheet 9 does not reach the output temperature set above in some case. To cope with such a case, the output temperature of the heat source may be set to a temperature higher than the melting point of the thermocompression bonding sheet 9 in order to heat the thermocompression bonding sheet 9 to a predetermined temperature.

Figure 8:
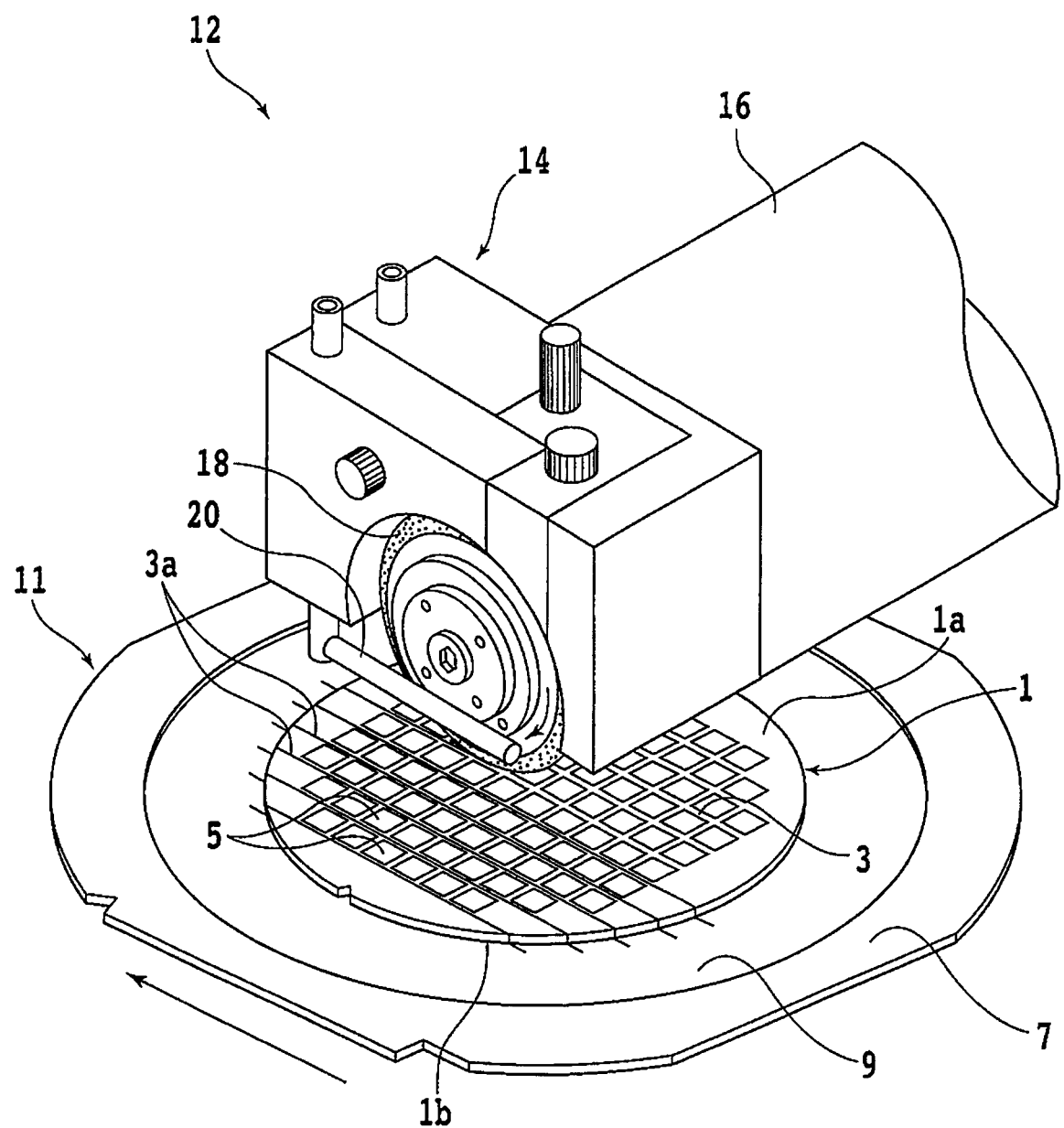
FIG. 8 is a schematic perspective view depicting a dividing step.

After performing the uniting step mentioned above, a dividing step is performed in such a manner that the wafer 1 in the condition of the frame unit 11 is cut by a cutting blade to obtain individual device chips in the processing method for the wafer 1 according to this preferred embodiment. The dividing step is performed by using a cutting apparatus 12 depicted in FIG. 8, for example. FIG. 8 is a schematic perspective view depicting the dividing step. As depicted in FIG. 8, the cutting apparatus 12 includes a cutting unit 14 for cutting a workpiece and a chuck table (not depicted) for holding the workpiece. The cutting unit 14 includes a cutting blade 18 having an annular abrasive portion (cutting edge) for cutting the workpiece and a spindle (not depicted) for supporting the cutting blade 18 so as to rotate the cutting blade 18. The cutting blade 18 has a central through hole for mounting the front end of the spindle. The cutting blade 18 is composed of an annular base (hub) having the above-mentioned central through hole and an annular abrasive portion provided along the outer circumference of the annular base.

The spindle is rotatably supported in a spindle housing 16, and the base end of the spindle is connected to a spindle motor (not depicted) accommodated in the spindle housing 16. Accordingly, the cutting blade 18 can be rotated by operating the spindle motor. The chuck table has an upper surface as a holding surface for holding the wafer 1. When the workpiece is cut by the cutting blade 18, heat is generated by the friction between the cutting blade 18 and the workpiece. Further, when the workpiece is cut by the cutting blade 18, cutting dust is generated from the workpiece. To remove such heat and cutting dust due to the cutting of the workpiece, a cutting water such as pure water is supplied to the cutting blade 18 and the workpiece during the cutting of the workpiece. Accordingly, the cutting unit 14 includes a pair of cutting water nozzles 20 for supplying a cutting water to the cutting blade 18 and the workpiece, in which the pair of cutting water nozzles 20 are located on both sides of the cutting blade 18. In FIG. 8, only one of the two cutting water nozzles 20 is depicted.

In cutting the wafer 1, the frame unit 11 is placed on the chuck table in the condition where the front side 1a of the wafer 1 is exposed upward. Accordingly, the wafer 1 is held through the thermocompression bonding sheet 9 on the chuck table. Thereafter, the chuck table is rotated to make the division lines 3 extending in the first direction on the front side 1a of the wafer 1 parallel to a feeding direction in the cutting apparatus 12. Further, the chuck table and the cutting unit 14 are relatively moved in a direction perpendicular to the feeding direction in a horizontal plane to thereby position the cutting blade 18 directly above an extension of a predetermined one of the division lines 3 extending in the first direction.

Thereafter, the spindle is rotated to thereby rotate the cutting blade 18. Thereafter, the cutting unit 14 is lowered to a predetermined height, and the chuck table and the cutting unit 14 are relatively moved in the feeding direction parallel to the upper surface of the chuck table. Accordingly, the abrasive portion of the cutting blade 18 being rotated comes into contact with the wafer 1 to thereby cut the wafer 1 along the predetermined division line 3 in the feeding direction. As a result, a dividing groove 3a is formed along the predetermined division line 3 so as to fully cut the wafer 1 and the thermocompression bonding sheet 9. After cutting the wafer 1 and the thermocompression bonding sheet 9 along the predetermined division line 3, the chuck table and the cutting unit 14 are relatively moved in an indexing direction perpendicular to the feeding direction by the pitch of the division lines 3. Thereafter, the above cutting operation is similarly performed along the next division line 3 adjacent to the above predetermined division line 3. After similarly performing the cutting operation along all of the other division lines 3 extending in the first direction, the chuck table is rotated 90 degrees about its axis perpendicular to the holding surface, so that the other division lines 3 extending in the second direction perpendicular to the first direction become parallel to the feeding direction. Thereafter, the above cutting operation is similarly performed along all of the other division lines 3 extending in the second direction. After performing the cutting operation along all of the other division lines 3 extending in the second direction, the dividing step is finished.

The cutting apparatus 12 may include a cleaning unit (not depicted) provided in the vicinity of the cutting unit 14. That is, the wafer 1 cut by the cutting unit 14 may be transferred to the cleaning unit and then may be cleaned by the cleaning unit. For example, the cleaning unit includes a cleaning table having a holding surface for holding the frame unit 11 and a cleaning water nozzle adapted to be horizontally moved in opposite directions above the frame unit 11 held on the holding surface of the cleaning table. The cleaning water nozzle functions to supply a cleaning water such as pure water to the wafer 1. The cleaning table is rotatable about its axis perpendicular to the holding surface. In operation, the cleaning table is rotated about its axis and at the same time, the cleaning water is supplied from the cleaning water nozzle to the wafer 1. During this supply of the cleaning water, the cleaning water nozzle is horizontally moved in opposite directions along a path passing through the position directly above the center of the holding surface of the cleaning table. Accordingly, the entire surface of the front side 1a of the wafer 1 can be cleaned by the cleaning water.

By performing the dividing step as mentioned above, the wafer 1 is divided into the individual device chips, which are supported to the thermocompression bonding sheet 9. In cutting the wafer 1, the cutting unit 14 is positioned at a predetermined height such that the lower end of the cutting blade 18 is lower in level than the back side 1b of the wafer 1, in order to reliably divide the wafer 1. Accordingly, when the wafer 1 is cut by the cutting blade 18, the thermocompression bonding sheet 9 bonded to the back side 1b of the wafer 1 is also cut by the cutting blade 18, so that cutting dust due to the thermocompression bonding sheet 9 is generated. In the case that an adhesive tape having an adhesive layer is used in the frame unit 11 in place of the thermocompression bonding sheet 9, cutting dust due to the adhesive layer of the adhesive tape is generated. In this case, the cutting dust is taken into the cutting water supplied from the cutting water nozzles 20, and then diffused on the front side 1a of the wafer 1. The cutting dust due to the adhesive layer is apt to adhere again to the front side of each device 5. Furthermore, it is not easy to remove the cutting dust adhered to the front side of each device 5 in a cleaning step of cleaning the wafer 1 after the dividing step. When the cutting dust due to the adhesive layer adheres to each device 5, there arises a problem such that each device chip divided from the wafer 1 may be degraded in quality.

To the contrary, the processing method for the wafer 1 according to this preferred embodiment has the following advantage. In this preferred embodiment, the thermocompression bonding sheet 9 having no adhesive layer is used in the frame unit 11 in place of an adhesive tape having an adhesive layer. Although the cutting dust due to the thermocompression bonding sheet 9 is generated and then diffused on the front side 1a of the wafer 1 as being taken into the cutting water, this cutting dust does not adhere to the wafer 1, but it is reliably removed in the subsequent cleaning step. Accordingly, it is possible to suppress a degradation in quality of each device chip due to the cutting dust.

Further, when the wafer 1 is cut by the cutting apparatus 12 to form the dividing groove 3a along each division line 3 as mentioned above, there is a case that each device chip may have a defect such as chipping along the side edge of each dividing groove 3a. If the size of the chipping exceeds an allowable range, the performance of each device chip is impaired. To cope with this problem, each device chip obtained is observed after performing the dividing step, thereby checking whether or not the chipping has occurred or checking whether or not the size of the chipping falls within an allowable range.

In the case of checking whether or not the chipping is present on the back side of each device chip, the back side of each device chip is observed through the thermocompression bonding sheet 9. In the case that an adhesive tape having an adhesive layer is used in place of the thermocompression bonding sheet 9 in the frame unit 11, the back side of each device chip is observed through the adhesive tape. However, visibility is impaired by the adhesive layer of the adhesive tape, so that the back side of each device chip cannot be clearly observed in this case. To the contrary, in the processing method for the wafer 1 according to this preferred embodiment, the thermocompression bonding sheet 9 having no adhesive layer is used in the frame unit 11, so that there is no possibility of the impairment of visibility due to an adhesive layer.

Figure 9A:
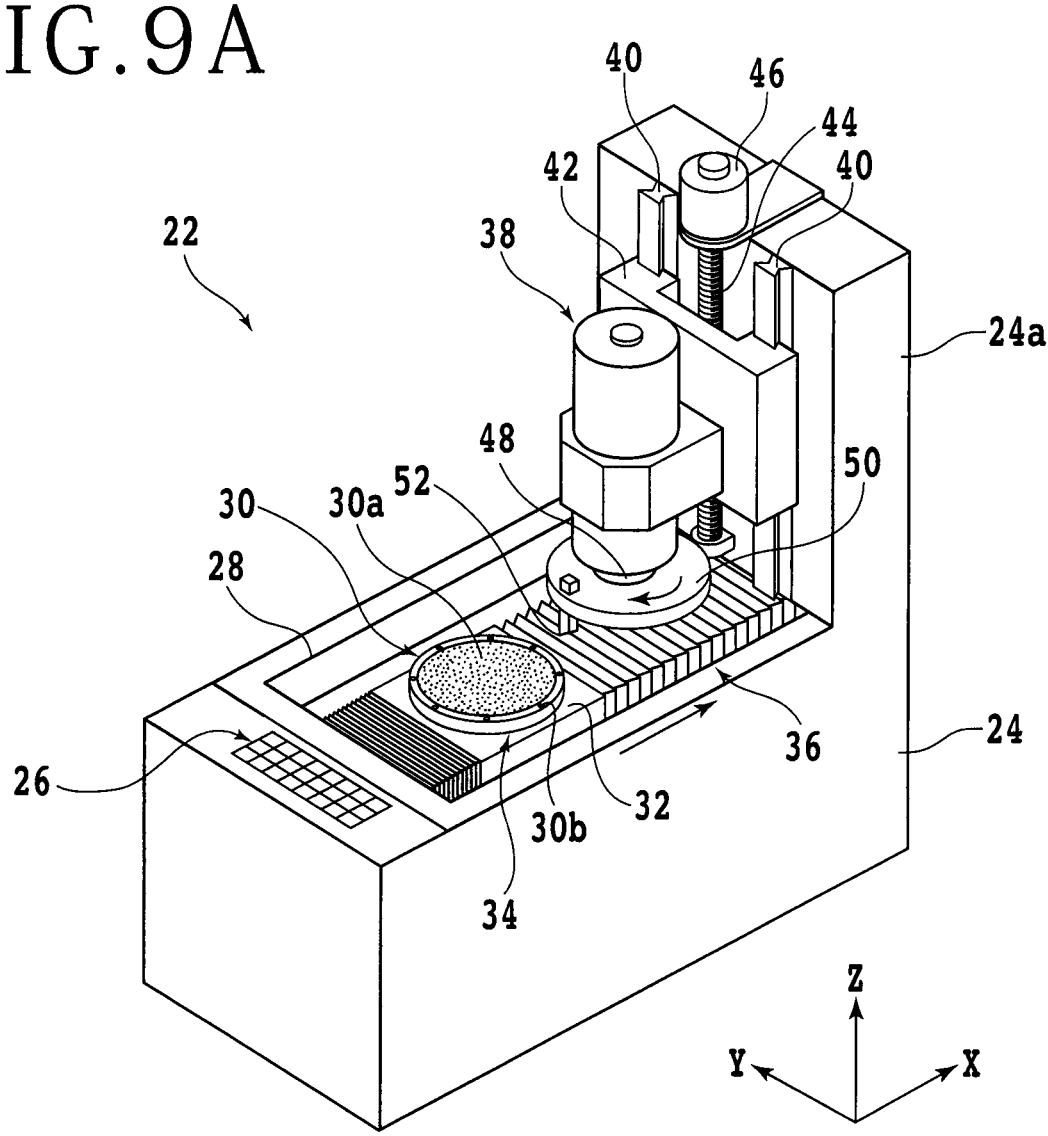
FIG. 9A is a schematic perspective view of a tool cutting apparatus (a surface planer)

However, in forming the frame unit 11 in the uniting step mentioned above, the thermocompression bonding sheet 9 is prepared in the form of a roll and the thermocompression bonding sheet 9 is drawn out from the roll in actual use, for example. Accordingly, both side surfaces of the thermocompression bonding sheet 9 is not flat (i.e., not smooth), so as to avoid close contact between a radially inside portion and a radially outside portion of the thermocompression bonding sheet 9 in the form of the roll. The thermocompression bonding sheet 9 has a first surface and a second surface opposite to the first surface, in which the first surface of the thermocompression bonding sheet 9 is bonded to the wafer 1 by heat. If the second surface of the thermocompression bonding sheet 9 is not flat, light scatters on the second surface of the thermocompression bonding sheet 9 in observing the back side of each device chip through the thermocompression bonding sheet 9, so that the back side of each device chip cannot be clearly observed. For example, the second surface of the thermocompression bonding sheet 9 initially has asperities having a height of about 10 to 20 µm, causing the scattering of light. To cope with this problem, in the processing method for the wafer 1 according to this preferred embodiment, a flattening step is performed before or after performing the dividing step to flatten the second surface of the thermocompression bonding sheet 9 in its central portion bonded to the wafer 1. The flattening step is performed by using a tool cutting apparatus 22 (a surface planer) having a cutting tool movable on an annular path as depicted in FIG. 9A. FIG. 9A is a schematic perspective view of the tool cutting apparatus 22 for performing the flattening step.

As depicted in FIG. 9A, the tool cutting apparatus 22 has a base 24 for supporting various components. An operation panel 26 for use in operating each component of the tool cutting apparatus 22 is provided on the upper surface of the base 24 at a front portion thereof. A rectangular opening 28 along the X direction is formed on the upper surface of the base 24. An X movable table 32 movable in the X direction is provided in the opening 28. A check table 30 for holding the frame unit 11 including the wafer 1 (device chips) under suction is mounted on the upper surface of the X movable table 32. A circular porous member 30a having a diameter larger than that of the wafer 1 is provided on the upper surface of the chuck table 30. The upper surface of the porous member 30a functions as a holding surface for holding the wafer 1 (device chips). An annular peripheral portion is formed outside the porous member 30a on the upper surface of the chuck table 30, and a plurality of suction openings 30b for holding the ring frame 7 of the frame unit 11 under suction are formed on this annular peripheral portion of the upper surface of the chuck table 30. A suction passage (not depicted) is formed inside the chuck table 30. One end of this suction passage is connected to the porous member 30a and the suction openings 30b, and the other end of this suction passage is connected to a vacuum source (not depicted).

Figure 9B:
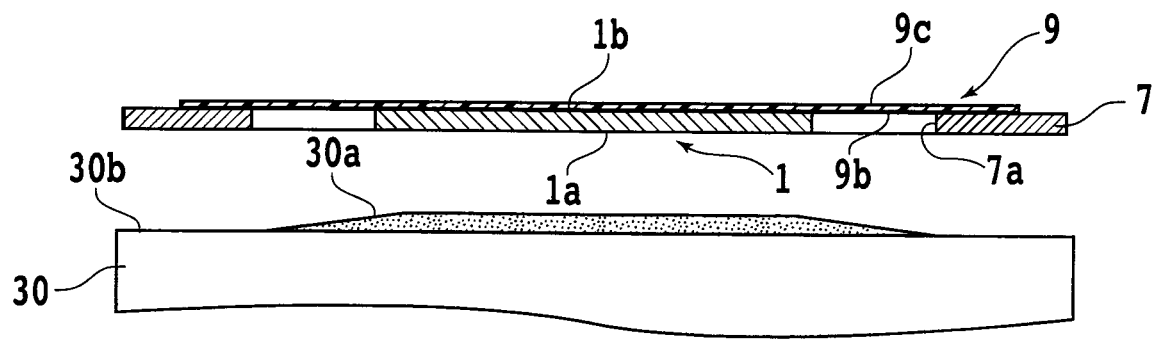
FIG. 9B is a schematic side view of a chuck table included in the tool cutting apparatus depicted in FIG. 9A.

FIG. 9B is a schematic side view of the chuck table 30 in connection with a sectional view of the frame unit 11. As depicted in FIG. 9B, the upper surface of the porous member 30a is composed of a flat circular central area higher in level than the annular peripheral portion of the upper surface of the chuck table 30 and an annular inclined area inclined downward from the outer circumference of the central area in a radially outward direction. The central area of the upper surface of the porous member 30a has a diameter equal to or greater than the diameter of the wafer 1. As depicted in FIG. 9B, the thermocompression bonding sheet 9 has a first surface 9b bonded to the back side 1b of the wafer 1 and a second surface 9c opposite to the first surface 9b. Accordingly, the second surface 9c of the thermocompression bonding sheet 9 bonded to the wafer 1 is exposed upward. In holding the frame unit 11 on the chuck table 30, the frame unit 11 is first positioned above the chuck table 30 in the condition where the first surface 9b of the thermocompression bonding sheet 9 bonded to the wafer 1 is oriented downward as depicted in FIG. 9B. Thereafter, the position of the frame unit 11 is adjusted such that the front side 1a of the wafer 1 is superimposed on the central area of the upper surface of the porous member 30a as viewed in plan. Thereafter, the frame unit 11 is lowered to be mounted on the chuck table 30. Thereafter, the vacuum source is operated to apply a vacuum to the frame unit 11 mounted on the chuck table 30, thereby holding the frame unit 11 on the chuck table 30 under suction. At this time, the second surface 9c of the thermocompression bonding sheet 9 projects upward in an area above the central area of the porous member 30a. That is, the second surface 9c of the thermocompression bonding sheet 9 in its central portion is higher in level than that in the peripheral portion in the condition where the frame unit 11 is held on the chuck table 30 under suction.

The chuck table 30 is initially set in a standby area 34 where the frame unit 11 is loaded or unloaded. Accordingly, the frame unit 11 is held under suction on the chuck table 30 set in the standby area 34. Thereafter, the chuck table 30 holding the frame unit 11 is moved in the X direction toward a processing area 36 by operating an X moving mechanism (not depicted) provided in the base 24. A tool cutting unit 38 for cutting a workpiece (i.e., the second surface 9c of the thermocompression bonding sheet 9) is provided above the processing area 36. A support portion 24a is formed at the rear end of the base 24 of the tool cutting apparatus 22 so as to project upward from the upper surface of the base 24. The tool cutting unit 38 is vertically movably supported to the support portion 24a.

A pair of Z guide rails 40 are provided on the front surface of the support portion 24a so as to extend in the Z direction. A Z movable plate 42 is slidably mounted on the Z guide rails 40. A nut portion (not depicted) is formed on the back side (the rear surface) of the Z movable plate 42, and a Z ball screw 44 parallel to the Z guide rails 40 is threadedly engaged with this nut portion. A Z pulse motor 46 for rotating the Z ball screw 44 is connected to the upper end of the Z ball screw 44. Accordingly, when the Z ball screw 44 is rotated by the Z pulse motor 46, the Z movable plate 42 is moved in the Z direction along the Z guide rails 40. The tool cutting unit 38 is fixed to the front surface of the Z movable plate 42 at a lower portion thereof. Accordingly, when the Z movable plate 42 is moved in the Z direction, the tool cutting unit 38 is also moved in the Z direction.

The tool cutting unit 38 includes a spindle 48 adapted to be rotated by a motor (not depicted) connected to the upper end (base end) of the spindle 48 and a disk-shaped mount 50 fixed to the lower end (front end) of the spindle 48. A single-point cutting tool 52 is mounted at a peripheral portion of the mount 50. The cutting tool 52 has a cutting tip adapted to come into contact with a workpiece, thereby cutting the workpiece. The cutting tip is formed of diamond. However, the material of the cutting tip is not limited to diamond. When the motor for rotating the spindle 48 is operated, the spindle 48 is rotated and the cutting tool 52 is accordingly rotated about the axis of the spindle 48, that is, the cutting tool 52 is moved on a circular path.

In performing the flattening step, the chuck table 30 is first positioned in the standby area 34, and the frame unit 11 is next held on the chuck table 30 under suction. Thereafter, the spindle 48 of the tool cutting unit 38 is rotated at a predetermined speed and the tool cutting unit 38 is lowered to a predetermined height. Thereafter, the chuck table 30 is moved to the processing area 36 to thereby bring the cutting tip of the cutting tool 52 moving on the circular path into contact with the second surface 9c of the thermocompression bonding sheet 9. As a result, the second surface 9c of the thermocompression bonding sheet 9 is cut by the cutting tip of the cutting tool 52. The predetermined height of the tool cutting unit 38 is set to a height where the cutting tip of the cutting tool 52 comes into contact with the central raised area of the second surface 9c of the thermocompression bonding sheet 9 corresponding to the central area of the first surface 9b bonded to the wafer 1, in which the central raised area of the second surface 9c is superimposed on the central area of the first surface 9b as viewed in plan. When the chuck table 30 is moved so as to pass through the position below the tool cutting unit 38, the central raised area of the second surface 9c of the thermocompression bonding sheet 9 is entirely cut by the cutting tip of the cutting tool 52, so that the asperities formed on the second surface 9c in the central raised area are removed to be flattened.

Figure 10:
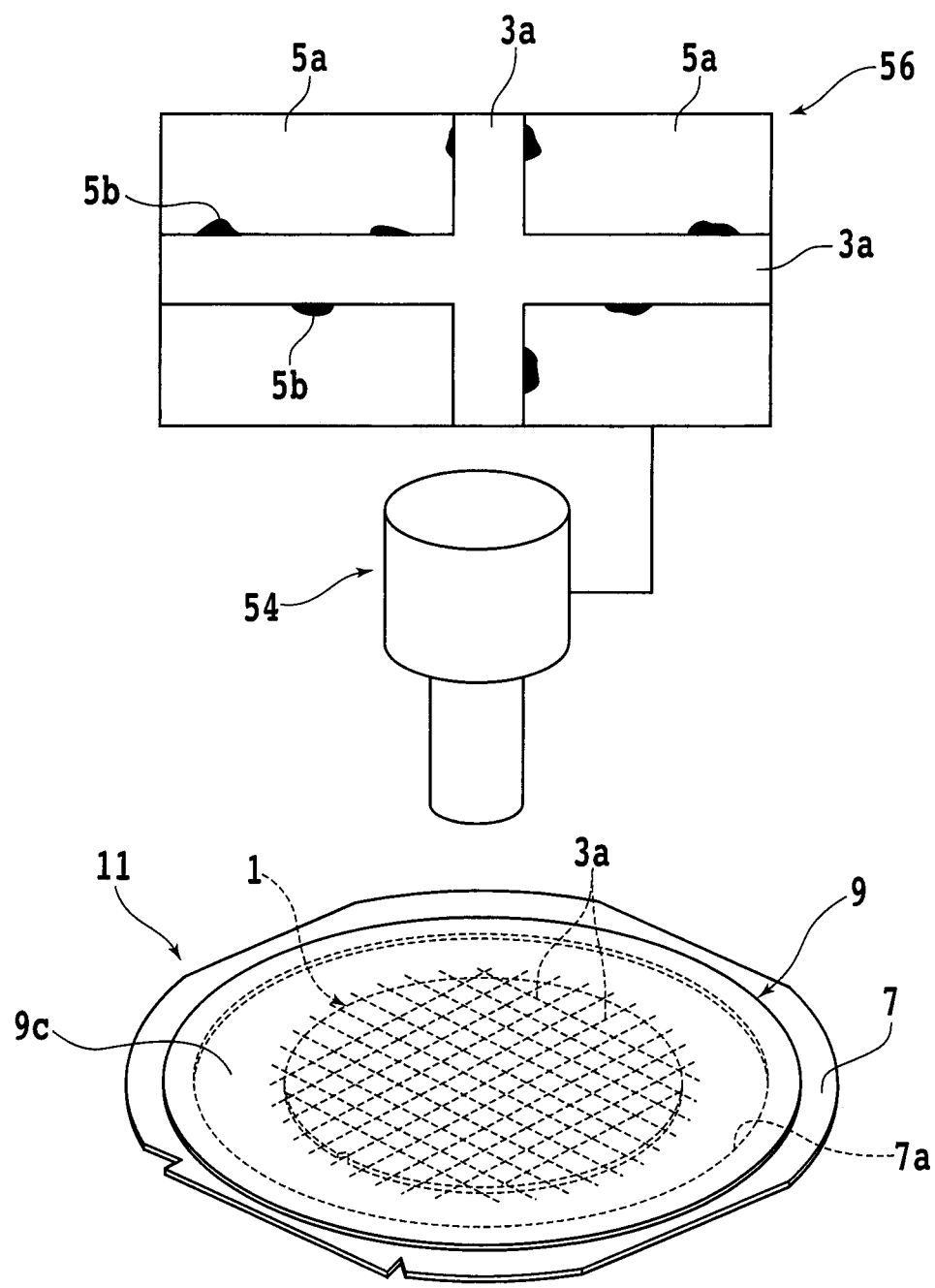
FIG. 10 is a schematic perspective view depicting a back side observing step.

In this manner, the asperities on the second surface 9c of the thermocompression bonding sheet 9 bonded to the wafer 1 are removed by performing the flattening step. Accordingly, the scattering of light on the second surface 9c can be suppressed, so that the back side 1b of the wafer 1 (i.e., the back side of each device chip) can be observed through the thermocompression bonding sheet 9 with high accuracy. In the processing method for the wafer 1 according to this preferred embodiment, a back side observing step is performed after performing the flattening step. In the back side observing step, the back side of each device chip is observed through the thermocompression bonding sheet 9 from the second surface 9c flattened above, thereby checking the condition of each dividing groove 3a. FIG. 10 is a schematic perspective view depicting the back side observing step. More specifically, FIG. 10 is a perspective view of an imaging unit 54 and the frame unit 11 in the condition where the second surface 9c of the thermocompression bonding sheet 9 is oriented upward so as to be opposed to the imaging unit 54. FIG. 10 also depicts an image 56 obtained by the imaging unit 54. In the perspective view of the frame unit 11 depicted in FIG. 10, the back side 1b of the wafer 1, i.e., the back side of each device chip and the dividing grooves 3a are visually recognized through the thermocompression bonding sheet 9 as depicted by broken lines.

As described above, the second surface 9c of the thermocompression bonding sheet 9 has been flattened by the flattening step. Accordingly, as depicted in FIG. 10, the image 56 obtained by the imaging unit 54 is a clear image. The image 56 includes an image of the dividing grooves 3a formed in the dividing step and an image of the back side 5a of each device chip obtained by forming the dividing grooves 3a to divide the wafer 1. Further, in the case that a defect such as chipping 5b is formed at the edge of each device chip along the side edge of each dividing groove 3a, the image 56 also includes a clear image of the defect such as the chipping 5b.

In the processing method for the wafer 1 according to this preferred embodiment, the defect such as the chipping 5b generated on each device chip can be evaluated in detail, so that whether or not each device chip obtained from the wafer 1 is good can be properly determined. Further, since the defect can be evaluated in detail as mentioned above, there is an advantage in selecting the processing conditions where the wafer 1 can be processed with the defect reduced.

Thus, the back side observing step is performed to determine whether or not each device chip is good. If each device chip is good, a pickup apparatus (not depicted) is used to pick up each device chip from the thermocompression bonding sheet 9 of the frame unit 11. Thereafter, each device chip is mounted on a predetermined object such as a substrate for use. For example, the pickup apparatus includes an expanding mechanism for expanding a central portion of the thermocompression bonding sheet 9 as present in the inside opening 7a of the ring frame 7 in the radially outward direction of the wafer 1 divided. Accordingly, the spacing defined between any adjacent ones of the device chips can be increased by operating the expanding mechanism to expand the thermocompression bonding sheet 9 as mentioned above. As a result, each device chip can be easily picked up from the thermocompression bonding sheet 9. The pickup apparatus may further include a rod-shaped pushup mechanism for pushing up each device chip from the under side of the thermocompression bonding sheet 9 of the frame unit 11. Further, an assist mechanism for facilitating the pickup of each device chip may be provided at the upper end of the pushup mechanism. Examples of the assist mechanism include an air blowing hole for blowing air to the thermocompression bonding sheet 9, a heating mechanism capable of heating the thermocompression bonding sheet 9, a cooling mechanism capable of cooling the thermocompression bonding sheet 9, and an ultrasonic vibrator capable of applying ultrasonic vibration to the thermocompression bonding sheet 9.

The present invention is not limited to the above preferred embodiment, but various modifications may be made. For example, while the polyolefin sheet usable as the thermocompression bonding sheet 9 is a polyethylene sheet, a polypropylene sheet, or a polystyrene sheet in the above preferred embodiment, the polyolefin sheet usable in one aspect of the present invention is not limited to the above examples. That is, the polyolefin sheet usable in one aspect of the present invention may be formed of any other materials (polyolefins) such as a copolymer of propylene and ethylene and an olefin elastomer. Further, while the polyester sheet usable as the thermocompression bonding sheet 9 is a polyethylene terephthalate sheet or a polyethylene naphthalate sheet in the above preferred embodiment, the polyester sheet usable in one aspect of the present invention is not limited to the above examples. That is, examples of the polyester sheet usable in the present invention may further include a polytrimethylene terephthalate sheet, a polybutylene terephthalate sheet, and a polybutylene naphthalate sheet.

Further, while the flattening step of flattening the second surface 9c of the thermocompression bonding sheet 9 is performed after performing the dividing step of dividing the wafer 1 in the above preferred embodiment, one aspect of the present invention is not limited to this configuration. That is, the flattening step may be performed before performing the dividing step in the present invention. Also in this case, the back side of each device chip can be clearly observed in performing the back side observing step. Further, while the flattening step is performed by using the tool cutting apparatus 22 to flatten the second surface 9c of the thermocompression bonding sheet 9 in the above preferred embodiment, one aspect of the present invention is not limited to this configuration. That is, any other methods may be used to flatten the second surface 9c of the thermocompression bonding sheet 9 in one aspect of the present invention. For example, the flattening step may be performed by using the heat roller 6 depicted in FIG. 5, in which the heat roller 6 is heated and then rotated about its axis on the second surface 9c of the thermocompression bonding sheet 9, thereby flattening the second surface 9c.

In the case that the uniting step is performed by using the heat roller 6 depicted in FIG. 5 to attach the first surface 9b of the thermocompression bonding sheet 9 to the ring frame 7 and the wafer 1 by thermocompression bonding, the second surface 9c of the thermocompression bonding sheet 9 is flattened by the heat roller 6 simultaneously with the thermocompression bonding of the thermocompression bonding sheet 9. In other words, the flattening step can be performed simultaneously with the uniting step. Accordingly, in this case, it is unnecessary to separately perform the flattening step of flattening the second surface 9c of the thermocompression bonding sheet 9.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer along a plurality of division lines to obtain a plurality of individual device chips, the division lines being formed on a front side of the wafer to thereby define a plurality of separate regions where a plurality of devices are individually formed, the wafer processing method comprising:
   a ring frame preparing step of preparing a ring frame having an inside opening for accommodating the wafer;
   a thermocompression bonding sheet providing step of positioning the wafer in the inside opening of the ring frame and providing a thermocompression bonding sheet having no adhesive layer, the thermocompression bonding sheet provided on a back side of the wafer and on a back side of the ring frame, the thermocompression bonding sheet having a first surface and a second surface opposite to the first surface, the first surface of the thermocompression bonding sheet being in direct contact with the back side of the wafer and the back side of the ring frame;
   a uniting step of heating the thermocompression bonding sheet as applying a pressure to the thermocompression bonding sheet after performing the thermocompression bonding sheet providing step, thereby uniting the wafer and the ring frame through the thermocompression bonding sheet by thermocompression bonding to form a frame unit in the condition where the wafer and the ring frame are exposed;
   a dividing step of cutting the wafer along each division line by using a cutting apparatus including a rotatable cutting blade after performing the uniting step, thereby forming a dividing groove along each division line to divide the wafer into the individual device chips;
   a flattening step of flattening the second surface of the thermocompression bonding sheet in its central area where the first surface of the thermocompression bonding sheet has been bonded to the wafer, before or after performing the dividing step; and
   a back side observing step of observing a back side of each device chip through the thermocompression bonding sheet from the second surface thereof after performing the flattening step, thereby checking a condition of the dividing groove formed in the dividing step.

2. The wafer processing method according to claim 1, wherein the flattening step includes a step of using a single-point cutting tool to cut the second surface of the thermocompression bonding sheet in the central area.

3. The wafer processing method according to claim 1, wherein the back side observing step includes a step of using an imaging unit to image the back side of each device chip.

4. The wafer processing method according to claim 1, wherein the thermocompression bonding sheet includes a thermoplastic resin sheet selected from the group consisting of a polyolefin sheet and a polyester sheet.

5. The wafer processing method according to claim 4, wherein the polyolefin sheet is formed of a material selected from the group consisting of polyethylene, polypropylene, and polystyrene.

6. The wafer processing method according to claim 5, wherein the polyolefin sheet is formed of polyethylene, and the polyolefin sheet is heated in the range of 120° C. to 140° C. in the uniting step.

7. The wafer processing method according to claim 5, wherein the polyolefin sheet is formed of polypropylene, and the polyolefin sheet is heated in the range of 160° C. to 180° C. in the uniting step.

8. The wafer processing method according to claim 5, wherein the polyolefin sheet is formed of polystyrene, and the polyolefin sheet is heated in the range of 220° C. to 240° C. in the uniting step.

9. The wafer processing method according to claim 4, wherein the polyester sheet is formed of a material selected from the group consisting of polyethylene terephthalate and polyethylene naphthalate.

10. The wafer processing method according to claim 9, wherein the polyester sheet is formed of polyethylene terephthalate, and the polyester sheet is heated in the range of 250° C. to 270° C. in the uniting step.

11. The wafer processing method according to claim 9, wherein the polyester sheet is formed of polyethylene naphthalate, and the polyester sheet is heated in the range of 160° C. to 180° C. in the uniting step.

12. The wafer processing method according to claim 1, wherein the wafer is formed of a material selected from the group consisting of silicon, gallium nitride, gallium arsenide, and glass.

13. The wafer processing method according to claim 1, wherein the uniting step includes heating the thermocompression bonding sheet using a heat gun.

14. The wafer processing method according to claim 1, wherein the uniting step includes heating and applying pressure to the thermocompression bonding sheet using a heat roller.

15. The wafer processing method according to claim 1, wherein the uniting step includes applying infrared light to the thermocompression bonding sheet using an infrared lamp to heat the thermocompression bonding sheet.

16. The wafer processing method according to claim 1, wherein the polyolefin sheet or the polyester sheet is transparent to visible light.

17. The wafer processing method according to claim 1, wherein the polyolefin sheet or the polyester sheet is translucent to visible light.

* * * * *